United States Patent
Wong et al.

(10) Patent No.: US 6,594,036 B1
(45) Date of Patent: Jul. 15, 2003

(54) ANALOG/MULTI-LEVEL MEMORY FOR DIGITAL IMAGING

(75) Inventors: Sau C. Wong, Hillsborough, CA (US); Leo Petropoulos, San Jose, CA (US); John H. Chan, Cupertino, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/086,785

(22) Filed: May 28, 1998

(51) Int. Cl.$^7$ ................................................. H04N 1/40
(52) U.S. Cl. ......................................... 358/471; 348/254
(58) Field of Search ............................. 358/471, 335, 358/334, 906, 909, 44; 348/254, 222, 264

(56) References Cited

U.S. PATENT DOCUMENTS

| | | | |
|---|---|---|---|
| 3,719,922 A | 3/1973 | Lopes, Jr. et al. | 340/5 MP |
| 3,927,308 A * | 12/1975 | Summers | 235/151.3 |
| 4,057,830 A | 11/1977 | Adcock | 358/127 |
| 4,131,919 A | 12/1978 | Lloyd et al. | 360/9 |
| 4,420,773 A | 12/1983 | Toyoda et al. | 358/335 |
| 4,445,189 A * | 4/1984 | Hyatt | 364/600 |
| 4,456,931 A | 6/1984 | Toyoda et al. | 358/335 |
| 4,602,291 A | 7/1986 | Temes | 358/221 |
| 4,614,966 A | 9/1986 | Yunoki et al. | 358/44 |
| 4,803,554 A | 2/1989 | Pape | 358/209 |
| 5,034,804 A | 7/1991 | Sasaki et al. | 358/41 |
| 5,049,983 A | 9/1991 | Matsumoto et al. | 358/44 |
| 5,055,930 A | 10/1991 | Nagasaki et al. | 358/213.11 |
| 5,155,584 A | 10/1992 | Taguchi et al. | 358/41 |
| 5,264,944 A | 11/1993 | Takemura | 358/335 |
| 5,272,535 A | 12/1993 | Elabd | 358/213.11 |
| 5,274,457 A | 12/1993 | Kobayashi et al. | 358/209 |
| 5,280,358 A * | 1/1994 | Yushiya | 358/213.17 |
| 5,295,077 A | 3/1994 | Fukuoka | 358/479 |
| 5,295,485 A | 3/1994 | Shinomura et al. | 128/660.07 |
| 5,317,407 A | 5/1994 | Michon | 358/213.11 |
| 5,339,275 A | 8/1994 | Hyatt | 365/45 |
| 5,541,653 A | 7/1996 | Peters et al. | 348/264 |
| 5,576,757 A | 11/1996 | Roberts et al. | 348/207 |
| 5,585,846 A | 12/1996 | Kim | 348/254 |
| 5,606,365 A | 2/1997 | Maurinus et al. | 348/222 |
| 5,619,445 A | 4/1997 | Hyatt | 365/45 |
| 5,644,636 A | 7/1997 | Fernandez | 380/4 |
| 5,680,341 A * | 10/1997 | Wong | 365/45 |
| 5,687,115 A | 11/1997 | Wong et al. | 365/185.23 |
| D389,501 S | 1/1998 | Mascarenas, Sr. et al. | D16/202 |
| 5,739,850 A | 4/1998 | Hori | 348/231 |
| 5,745,409 A * | 4/1998 | Wong | 365/185.03 |
| 5,760,727 A | 6/1998 | Lin | 341/155 |
| 5,818,757 A * | 10/1998 | So | 365/185.27 |
| 5,923,585 A | 7/1999 | Wong et al. | 365/185.13 |
| 5,969,986 A | 10/1999 | Wong et al. | 348/231 |
| 6,104,437 A | 8/2000 | Taira et al. | 365/185.13 |
| 6,134,145 A | 10/2000 | Wong | 348/56.3 |
| 6,177,956 B1 | 1/2001 | Anderson et al. | 348/231 |
| 6,282,462 B1 | 8/2001 | Hopkins | 700/253 |

* cited by examiner

Primary Examiner—Jerome Grant, II
Assistant Examiner—Negussie Worku
(74) Attorney, Agent, or Firm—Parsons Haue & de Runtz LLP

(57) ABSTRACT

A digital imaging system uses an analog/multi-level memory to store image data. The stored analog/multi-level data can then be accessed directly by an analog device or the data can be accessed by an A/D converter for conversion to a digital format. The digital data is then routed to any number of desired digital devices. By using an analog/multi-level memory instead of a digital memory to store image data, problems associated with storing large amounts of digital data are minimized or eliminated, such as loss of information from image compression and high costs of large digital memories and signal processing and compression circuits.

1 Claim, 5 Drawing Sheets

ANALOG/MULTI-LEVEL MEMORY FOR DIGITAL IMAGING

BACKGROUND OF THE INVENTION

1. Field of the Invention

This invention relates to signal processing and, in particular, to structures and processes for processing signals using an analog/multi-level memory.

2. Description of Related Art

FIG. 1 is a block diagram of a typical digital image processing system 100, such as a digital still camera. An image sensor 110, for example, a charge-coupled device (CCD) or CMOS sensor, first converts the image to electrical signals, such as voltages. An analog-to-digital (A/D) converter 120 then samples the analog signal and converts the signal into digital data. Some advantages of digitized information include processing flexibility and higher signal to noise ratio during transmission to reduce error rates. However, digital data can require very large memory storage capacities and transmission bandwidths.

For example, typical VGA images have a spatial resolution of approximately 307K pixels/frame (i.e., 480 rows with 640 samples or pixels per row). In a digital image, the image is captured, processed, stored, and transmitted as an array of numerical values. The image is divided up into squares in a grid, with each square in the grid referred to as a pixel or sample. The intensity of the image at each pixel is translated into a numerical value which is stored in the array. If the pixel has one of the primary colors (i.e., R, G, B) to be sampled with 8 bits resolution, then there are approximately 2.5 Mbits of data per frame (307K*8), which requires approximately 307 Kbytes of memory storage capacity to store the sampled image. Furthermore, if a digital still camera is required to capture 1 frame/sec, a data transmission rate or bandwidth of approximately 2.5 Mbits/sec is needed for a color image. Depending on the digital processing application, the memory storage and bandwidth requirements can be even higher than 307 Kbytes and 2.5 Mbits/sec, respectively. Such large memories and bandwidths are either impractical or may require high capacity memory devices and very high speed circuit elements with parallel processing which can make the digital processing system complicated and very costly.

Thus, the large memory storage and channel capacity requirements for digital image transmission and storage make it desirable to reduce the amount of digital data from A/D converter 120. By reducing the amount of data, the transmission bandwidth and/or the memory storage requirements are reduced. A well-known technique is to utilize a digital signal processing (DSP) and image compression circuit 130 to reduce the amount of digital data while storing enough data in memory to maintain a desired quality or resolution of the image. Image compression circuit 130 can use common techniques, such as JPEG or run-length coding, to take advantage of the fact that certain pixel values tend to be highly redundant, such as with neighboring individual pixels or neighboring frames. Image compression techniques, e.g., having compression ratios ranging from 4:1 to 20:1, can significantly reduce the number of bits required to represent images by removing these redundancies while still maintaining an acceptable quality of the reconstructed image.

After image compression, the reduced digital data can be stored in a digital memory device 140, such as a memory card having a Flash EEPROM. Read and interface circuits 150 then access the desired image data from memory device 140 and transmits the data to desired digital destinations, such as a digital display unit 160, a digital printer 170, a hard disk drive for a PC 180, or another digital memory 190. For example, with a digital still camera, elements 110 to 150 are typically embedded within the digital camera so that the digital memory 190 can be a memory card which is removable from the camera and available for subsequent processing of the stored image data.

Thus, with image compression, smaller memories and lower transmission rates are possible. However, by using DSP and image compression, some information is lost, which can adversely affect picture quality. DSP and image compression also require substantial amounts of time for performing complex and lengthy computations, which can adversely increase the time delay between successive picture frames. A fast burst-rate, which allows pictures to be taken in rapid succession, is an important consideration for high-speed professional cameras. Furthermore, power usage and required silicon area is increased, which can increase the cost of the digital image processing system, and make such systems undesirable for applications targeting the typical consumer market.

For example, digital still cameras currently available for the average consumer have typical resolutions less than 500K pixels/frame, which result in much poorer picture quality than conventional film. While some digital still cameras have resolutions greater than 1M pixels/frame, these high quality cameras are generally too costly for the typical consumer. Therefore, a need exists for a low-cost digital camera capable of high resolution pictures which can replace conventional film cameras. The high cost of today's digital still cameras is due primarily to higher internal memory storage and digital signal processing and image compression requirements, resulting in larger and more complex circuit elements. Accordingly, a simple, low-cost and high quality digital imaging system is desired which overcomes the problems discussed above with the conventional systems.

SUMMARY

In accordance with an aspect of the present invention, a digital imaging system has a non-volatile analog/multi-level memory to store analog/multi-level data directly from an image sensor or voice data from a microphone. The data from the analog memory can then be directly transmitted to analog devices, such as an analog display, analog printer, or external analog memory, or to an analog-to-digital (A/D) converter for conversion to digital data. Once the image data is converted to a digital format, the data can be processed for any number of desired digital destinations, such as downloading to a hard disc drive (HDD) for permanent storage or editing by photo-enhancement software, transmitting through the Internet, or writing into removable memory cards (e.g., Sandisk's Compact Flash or Intel's Miniature Card).

By storing analog data instead of digital data, there is no longer the problem of storing large amounts of digital data, which eliminates the need for digital signal processing (DSP) and image compression. Without image compression, no information is lost, resulting in an imaging system providing higher quality images. Further, without the need for DSP and image compression circuits, the imaging system is smaller, simpler, less expensive, and requires less power.

Different types of analog memories can be used to store the analog data, with the type depending on the source of the image and/or the display. For example, for applications requiring a high bandwidth, such as high resolution digital still cameras which require high bandwidths in order to minimize the time required between consecutive exposures, data needs to be stored and read out at very high rates. Accordingly, the analog memory must be of a type capable of meeting these needs.

According to one embodiment, the analog memory contains multiple storage segments which are interleaved for sampling and storing values representing an analog signal and for transmitting the stored signal. Various embodiments of this type of analog memory are described in commonly-owned U.S. Pat. No. 5,680,341 to Wong et al., issued Oct. 21, 1997, entitled "Pipelined Record and Playback For Analog Non-Volatile Memory", which is incorporated herein by reference in its entirety.

Each storage segment includes a sample-and-hold circuit and a write circuit coupled to a memory section associated with that segment and is capable of write operations that overlap write operations of other storage segments. Each storage segment can also include a read circuit and a sample-and-hold circuit coupled to an associated memory section and is capable of read operations that overlap read operations of other storage segments. Access to the storage segments are interleaved and operate sequentially during write or read, and the number of storage segments is selected according to a desired sampling frequency or bandwidth. Alternatively, both read and write operations of the storage segments can be carried out simultaneously and in parallel using multiple parallel pipelines, with each pipeline having at least one sample-and-hold circuit and at least one memory section. Analog memories of these types can accommodate the very high bandwidths required for certain high-end applications, such as digital still cameras and high fidelity music.

The analog signals stored in the analog memory can then be used as needed. For example, the analog signal can be directly read out to an analog display or analog printer, or the analog signal can be read out to an A/D converter for conversion to digital data. The resulting digital data can then be transmitted to desired digital destinations, such as an NTSC/PAL encoder for use with a television monitor or removable memory cards, or downloaded to a hard disk drive for photo-enhancement editing or later use by digital printers, displays, or transmission through the Internet.

Since the image is stored in the form of an analog signal and the analog signal is converted to digital data only when needed, the need for storing the digital imaging data is eliminated. As a result, image compression, which causes information to be lost, can also be eliminated. Without large digital memories and digital signal processing and image compression circuits, the cost of the digital imaging system can be greatly reduced while greatly improving the quality of the pictures.

This invention will be more fully understood upon consideration of the detailed description below, taken together with the accompanying drawings.

BRIEF DESCRIPTION OF THE DRAWINGS

Use of the same reference symbols in different FIGURES indicates similar or identical items.

DETAILED DESCRIPTION OF THE PREFERRED EMBODIMENTS

In accordance with one embodiment of the invention, a digital imaging system uses an analog/multi-level memory to store analog and/or multiple bits of data, which can be used in analog peripheral devices or converted into digital data for use in digital peripheral devices, thereby eliminating the need for digital signal processing (DSP), image compression, and digital data storage.

Figure 1:
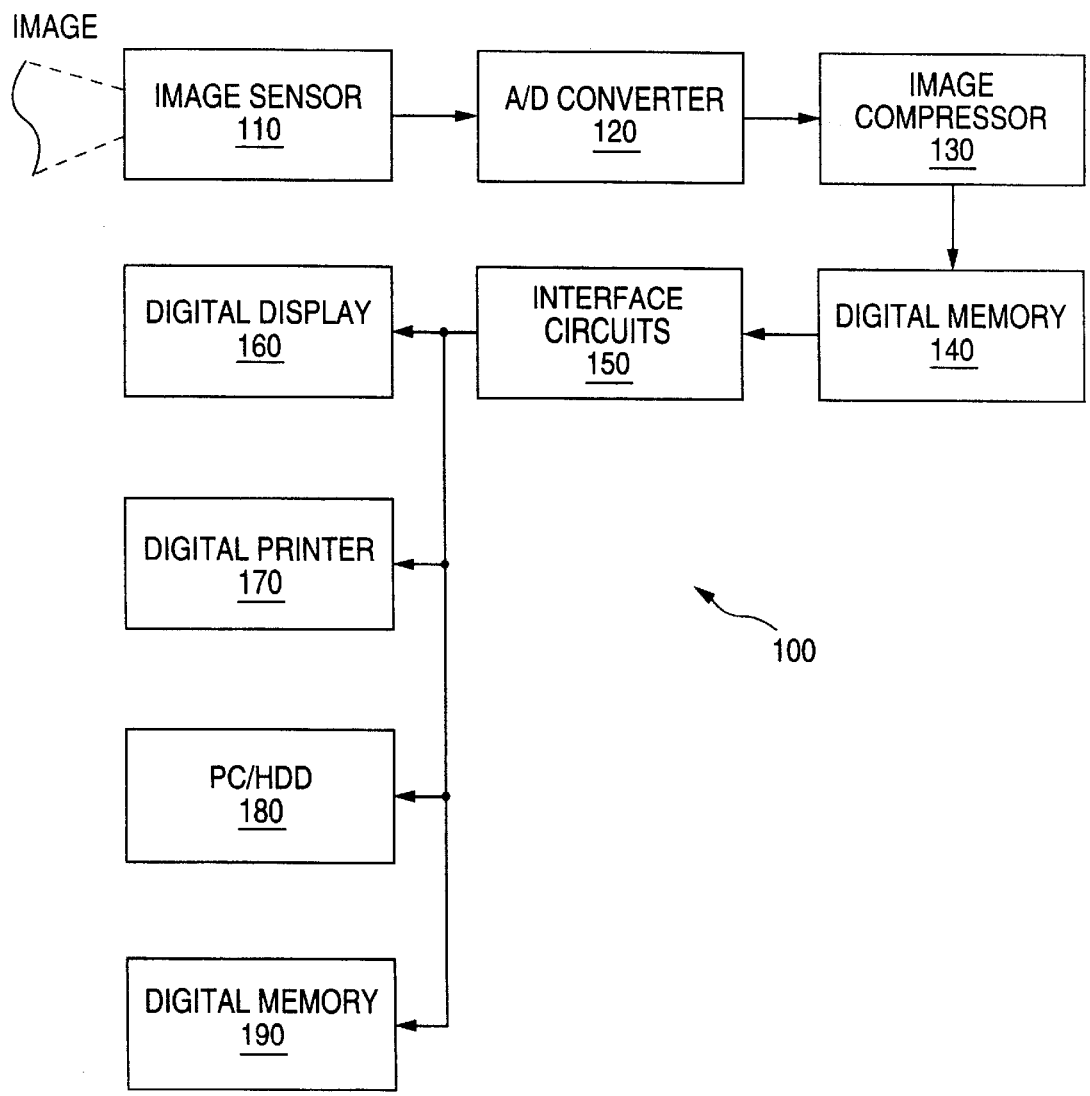
FIG. 1 shows a block diagram of a conventional digital imaging system.
Figure 2:
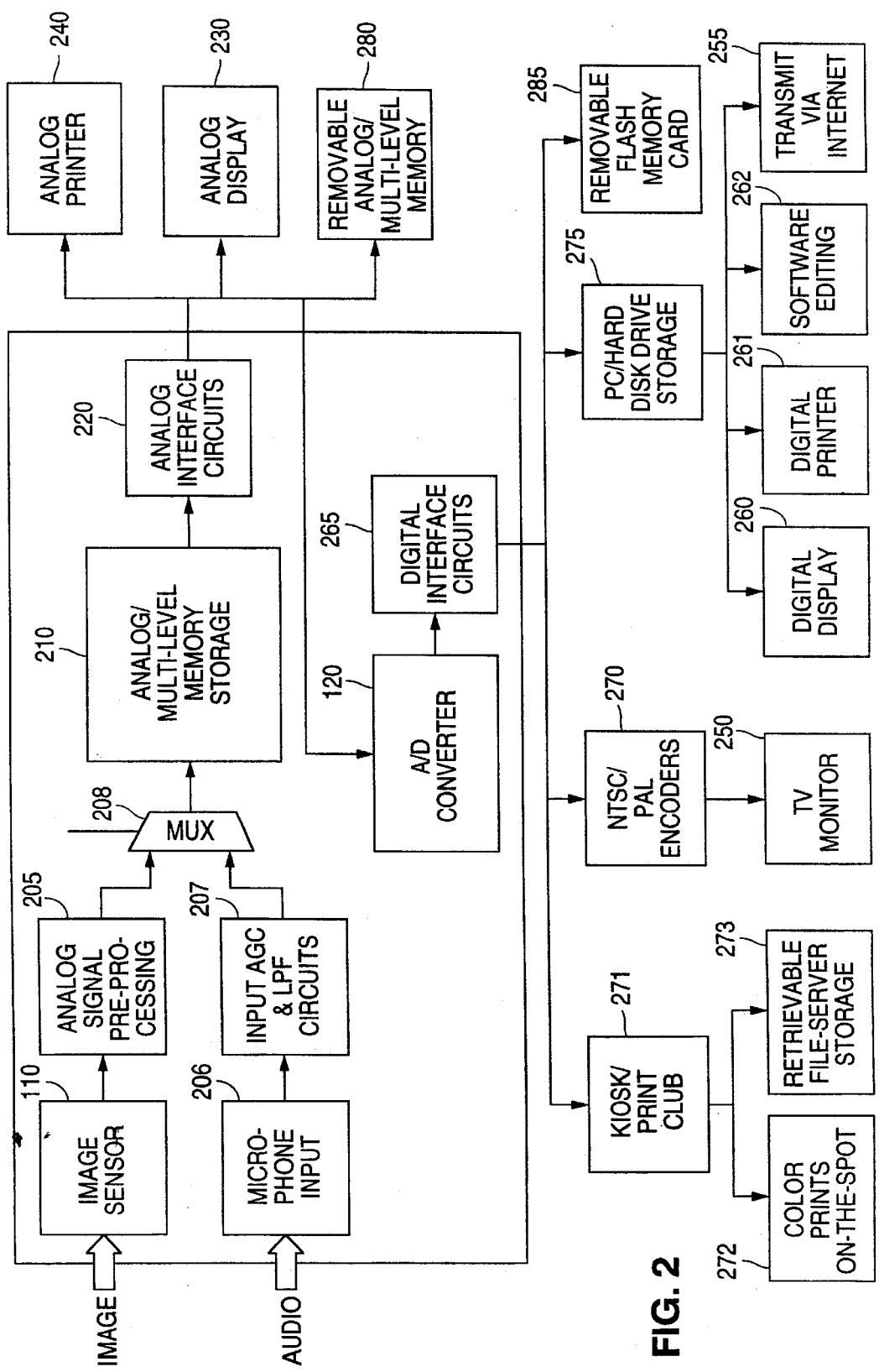
FIG. 2 shows a block diagram of a digital imaging system according to one embodiment of the present invention.

FIG. 2 is a block diagram of one embodiment of a digital imaging system 200 according to the present invention. Image sensor 110 first converts an image to electrical signals, such as voltages. Image sensor 110 can be, for example, a charge-coupled device (CCD), a CMOS device, a vidicon tube, or any other suitable image sensing device which converts the light falling on it from an image into an electrical signal. For example, in a CCD, as more light falls onto the photodiode cells of a CCD, more charge accumulates in the cells. After an integration period, the charge is read out from the cells, processed in analog signal pre-processing circuitry 205, and converted to a voltage for storage in an analog/multi-level memory 210. One pixel of image data with at least 8-bit resolution or at least 256 levels can be stored in each memory storage element in the memory array 210. As is known in the art, color images can be represented in terms of the primary colors red, green, and blue (RGB). The color image is recorded through a color filter having a red filter, a green filter, and a blue filter. Color image processing in pre-processing circuitry 205 typically includes correlated double sampling (CDS) for reduction of read-out noise and offset of sense amplifiers, color filter array (CFA) interpolation algorithms for color, gamma correction, and automatic gain control (AGC) for optimizing the dynamic range for analog/multi-level storage.

In addition to image signals, other types of signals can also be stored in analog/multi-level memory 210 depending on the application, such as voice signals from a microphone of a audio/video recorder or time and date stamps from digital cameras. FIG. 2 shows audio signals processed through a microphone 206 and input AGC and low pass filter (LPF) circuits 207 for storage in analog/multi-level memory 210. A multiplexer 208 can select whether the audio or video signal is to bestored in the memory 210. Commonly-owned U.S. Pat. No. 5,680,341 to Wong et al., incorporated above, describes exemplary embodiments of analog/multi-level memories suitable for the present invention.

Analog/multi-level memory 210 must be able to sample the voltage from image sensor 110 to meet bandwidth requirements of the imaging source. Analog/multi-level memory 210 must also be able to be read at a rate sufficient to meet the requirements of desired destination devices.

Figure 3:
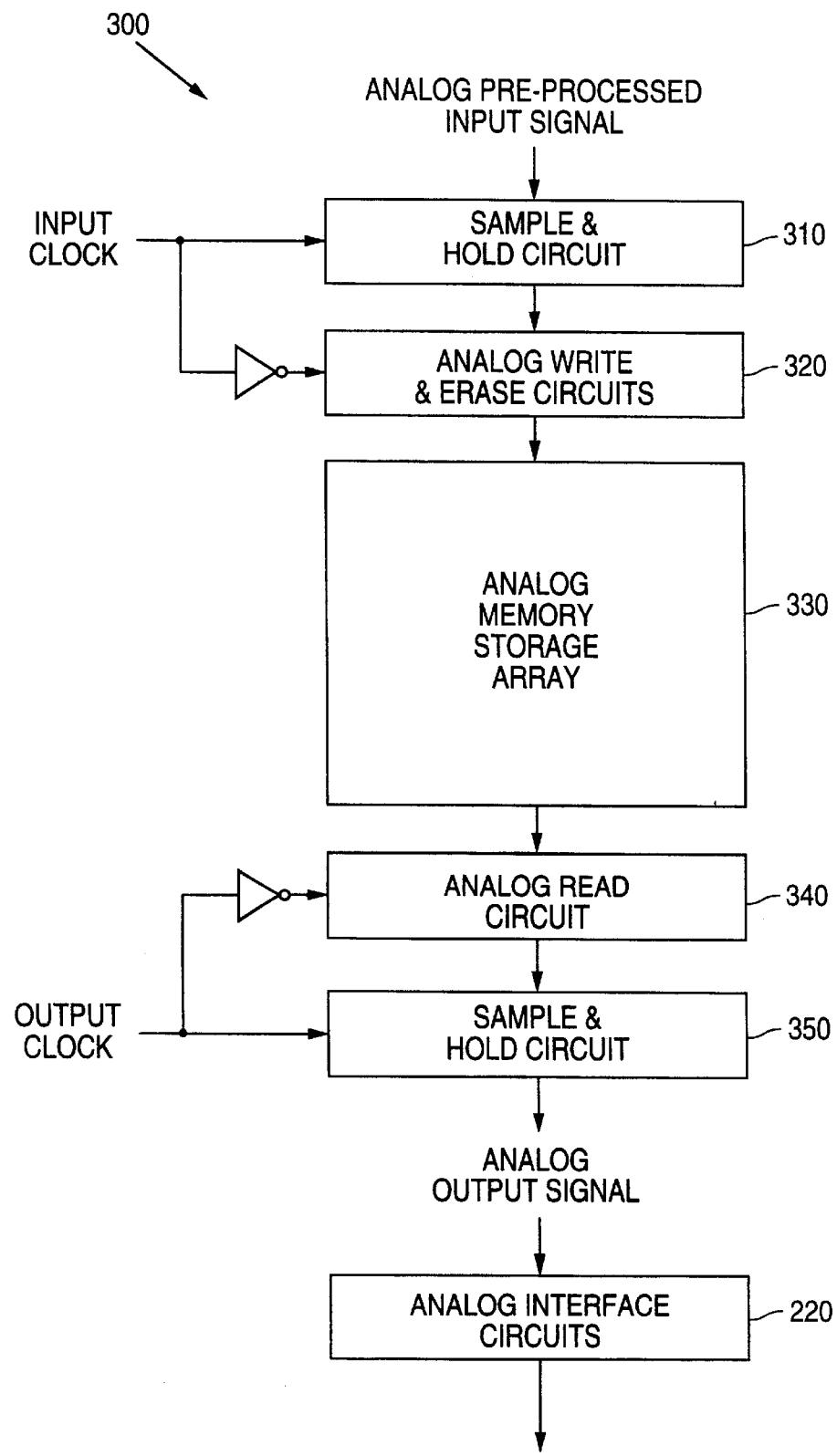
FIG. 3 shows a block diagram of an analog/multi-level memory module usable for the system of FIG. 2.

Lower bandwidth requirements can be met with using an analog memory system 300, such as shown in FIG. 3., as analog/multi-level memory 210 of FIG. 2. Analog memory system 300 has an input interface which includes a sample-and-hold circuit 310 and an analog write circuit 320 connected to an analog/multi-level memory array 330. An input clock determines the rate of sampling, and an output clock determines the rate at which the data stored in analog/multi-level memory array 330 is read out.

During sampling of the analog pre-processed input signal, an edge of the input clock signal triggers sample-and-hold circuit 310 which then samples the analog input signal and applies the resulting sample to analog write circuit 320. The input analog signal can be an image signal, an audio signal, or any other suitable analog signal. At a following edge of the input clock or after a predetermined sampling time, analog write circuit 320 begins writing the sampled value to a selected memory cell in analog/multi-level memory array 330. An address generator (not shown) can increment or otherwise select a new address each cycle of the input clock to write samples in a desired order in analog/multi-level memory array 330.

Analog/multi-level memory array 330 can use any suitable analog memory, such as EEPROMs or Flash EEPROMs with Fowler-Nordheim tunneling or EPROMs or Flash EPROMs with channel hot electron injection to raise the threshold voltage of a selected memory cell. EPROMs or Flash EPROMs are preferred because they provide shorter write times and allow higher sampling frequencies with minimum overhead. Analog write circuit 320 contains the circuitry necessary to generate the control gate, drain, and source voltages for setting the threshold voltage of a selected memory cell to a level representing the sample from sample-and-hold circuit 310. The exact nature of analog write circuit 320 depends upon the structure of analog/multi-level memory array 330, but is otherwise not critical to the invention. Commonly-owned U.S. Pat. No. 5,694,356 to Wong et al., issued Dec. 2, 1997, entitled "High Resolution Analog Storage EPROM and Flash EPROM," describes exemplary embodiments of write circuits for analog/multi-level EPROM and Flash EPROM and is incorporated by reference herein in its entirety.

In a system where sample-and-hold circuit 310 and analog write circuit 320 provide the only write path for samples, the maximum sampling frequency is limited by the write time of the individual memories. For example, if analog/multi-level memory array 330 is an EPROM or Flash EPROM array having a write time of 10 μs, the maximum sampling frequency and, thus the input clock, is about 100 kHz.

If higher sampling frequencies are needed to sample the analog signal, memory 300 can be combined with (N−1) similar memories to provide a set of N interleaved segments for storing the analog input signal. In such embodiments the maximum sampling frequency is N times the maximum frequency of the input clock. Accordingly, any desired sampling frequency can be achieved if a sufficient number of analog memory segments are combined. For example, if each interleaved segment can sample and write at a frequency of about 100 kHz, ten interleaved segments can be used in a digital imaging system requiring a sampling frequency of 1 MHz.

The output interface of memory 300 includes an analog read circuit 340 and a second sample-and-hold circuit 350 which samples a value from analog read circuit 340 to generate an output signal. During reading or transmission of the stored analog signal, an edge of an output clock signal triggers analog read circuit 340 which then reads a selected memory cell. The address of the selected memory cell changes each cycle of the output clock, in the same manner as the address used when sampling the signal. After the selected memory cell is read, sample-and-hold circuit 350 sets the output signal to indicate the stored sample. An erase operation for any of N memory arrays 330 can erase the entire memory array or selected sections of the memory array, and an erase operation can erase all of N memory arrays sequentially or simultaneously in parallel, using for, example, multiple parallel pipelines, with each pipeline having at least one sample-and-hold circuit and at least one memory element.

Figure 4:
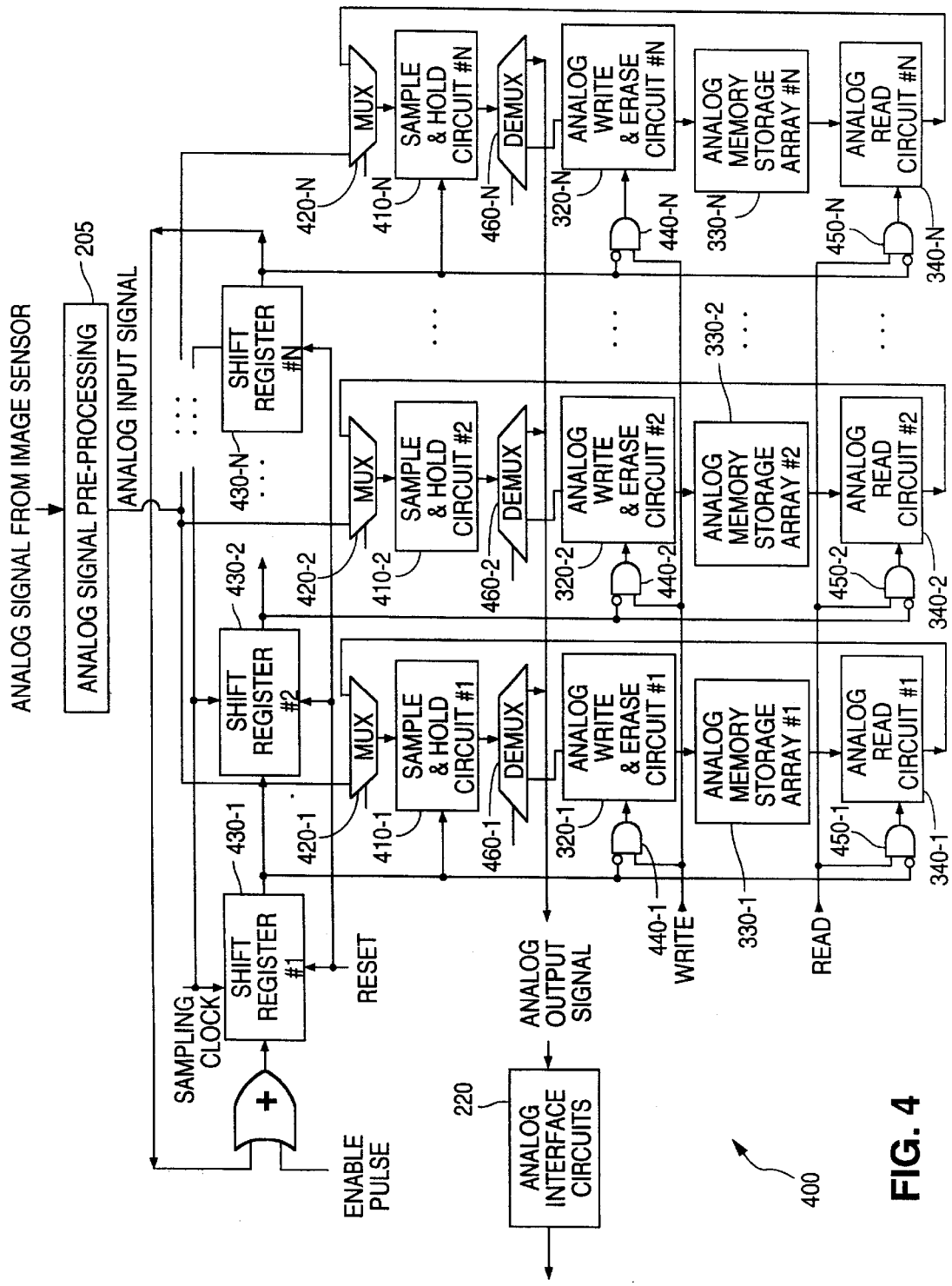
FIG. 4 shows a block diagram of an interleaved pipeline analog/multi-level memory usable for the system of FIG. 2.

FIG. 4 shows a block diagram of an interleaved pipeline analog memory system 400, which has multiple. sample-and-hold circuits 410-1 to 410-N for interleaved pipeline access, for use as analog/multi-level memory 210 of FIG. 2. During storage, a control signal WRITE is asserted, and a control signal READ is deasserted. Multiplexers 420-1 to 420-N connect the analog input signal to sample-and-hold circuits 410-1 to 410-N which sequentially sample the analog input signal from analog signal pre-processing circuitry 205 as a pulse propagates through shift registers 430-1 to 430-N. AND gates 440-1 to 440-N trigger respective write circuits 320-1 to 320-N on the falling edge of the signal from shift registers 430-1 to 430-N while signal WRITE is asserted. Demultiplexers 460-1 to 460-N route the samples from sample-and-hold circuits 410-1 to 410-N to analog write circuits 320-1 to 320-N which write the samples to memory arrays 330-1 to 330-N. Depending on the application, memory arrays 330-1 to 330-N can be erased sequentially or simultaneously, using methods known to those skilled in the art. For example, with a digital camera, an "erase-all-frames" operation erases memory arrays 330-1 to 330-N simultaneously, while a "frame-by-frame" erase operation erases a number of sections of cells within each memory array simultaneously.

During read, control signal READ is asserted, and control signal WRITE is deasserted. The falling edge of the signal from shift registers 430-1 to 430-N triggers analog read circuits 340-1 to 340-N via respective AND gates 450-1 to 450-N when signal READ is asserted. Multiplexers 420-1 to 420-N connect the output signals from analog read circuit 340-1 to 340-N to sample-and-hold circuits 410-1 to 410-N. Sample-and-hold and-hold circuits 410 sample the last value read, that is after the pulse has cycled through shift registers 430-1 to 430-N. Demultiplexers 460-1 to 460-N select one of the sample-and-hold circuits 410-1 to 410-N which supplies the current voltage for the analog output signal supplied to analog interface circuits 220.

Figure 5:
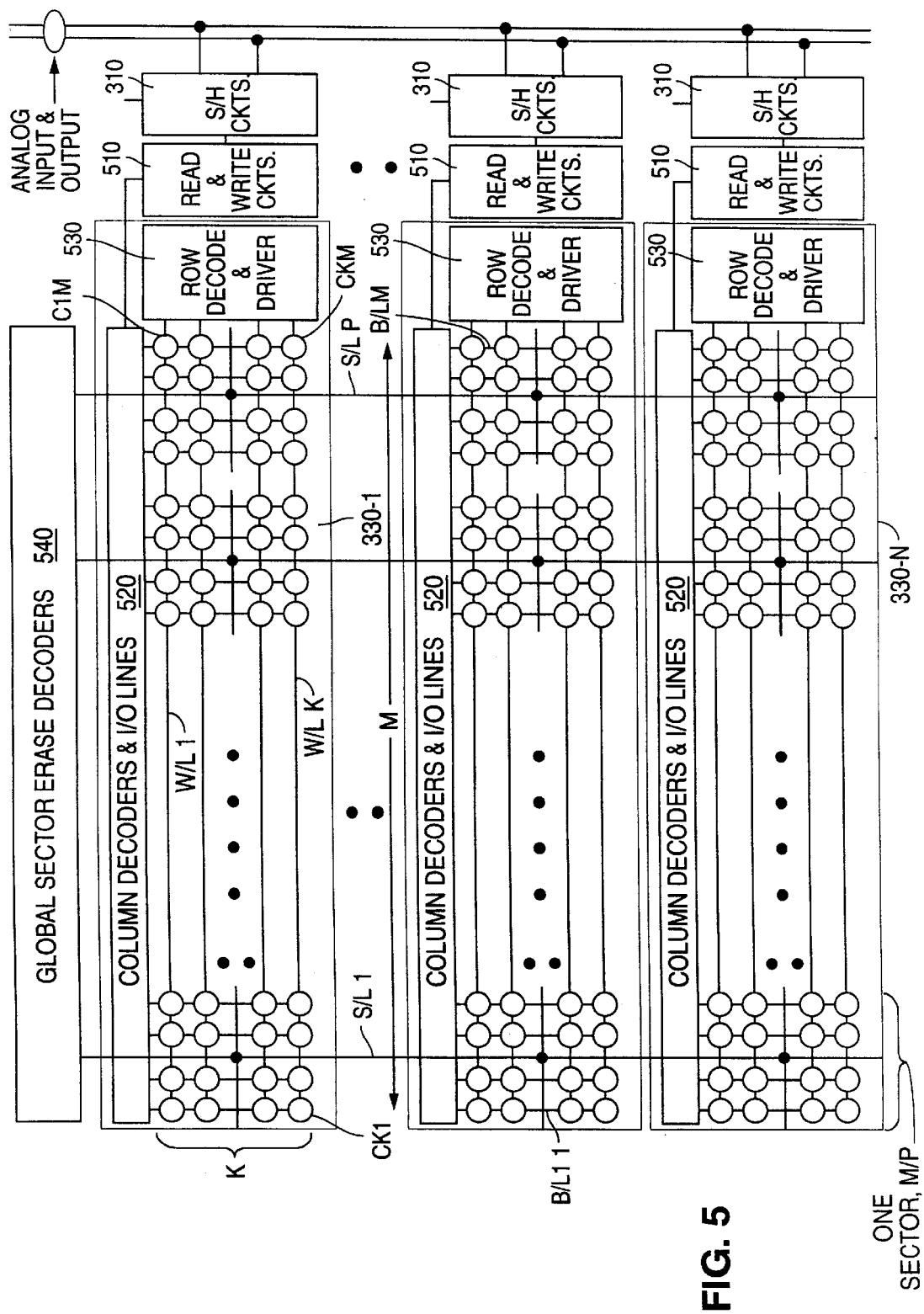
FIG. 5 is a diagram of N analog/multi-level memory arrays connected to allow sector erasing and interleaved pipeline access.

FIG. 5 shows a connection of N analog/multi-level memory arrays or segments 330-1 to 330-N according to one embodiment of the present invention, suitable for use as the analog/multi-level memory 210. Each memory array or segment 330 has K rows and M columns of memory cells C11 to CKM to store K*M pixels. The memory cells can be single n-channel floating gate transistors or other suitable memory devices such as EEPROMs or Flash EEPROMs with Fowler-Nordheim tunneling or EPROMs or Flash EPROMs with channel hot electron injection. Each memory array or segment 330 has K word-lines W/L1 to W/LK, with each word-line coupled to the control gates of the memory cells in the corresponding row, and M bit-lines B/L1 to B/LM, with each bit-line coupled to the drains of the memory cells in the corresponding column. Each of memory arrays or segments 330-1 to 330-N also has P common erase source-lines S/L1 to S/LP, with each source-line coupled to the sources of memory cells in the groups of M/P bit-lines. Each group of M/P-bit-lines forms an erase sector, which extends through all N memory arrays or segments.

When writing a data value, read and write circuits 510 transmit appropriate signals from sample-and-hold circuits 310 coupled to analog input and outputs, e.g., from analog signal pre-processing circuitry 205 and to analog interface circuits 220, to select a desired row address and a column address for a selected one of memory cells C11 to CMN to which the data value will be written. A column decoder with input/output lines 520 selects the column or bit-line for the desired cell by applying the appropriate voltages to the memory cell drains, depending on the structure of the memory cell. A row decoder and driver 530 selects the row or word-line for the desired cell by applying appropriate voltages to the memory cell gates. These addresses are generated sequentially or randomly for recording analog or multi-level samples of a continuous analog signal.

When reading a data value, read and write circuits 510 transmit the analog/multi-level data read from the selected memory cells in each of the memory arrays or segments 330-1 to 330-N to sample-and-hold circuits 310. At desired times, the sample-and-hold circuits 310 transmit the stored analog/multi-level data to the coupled analog input and output lines. Write and read operations on the analog/multi-level data can be performed sequentially through an interleaved architecture or simultaneously through parallel pipelined architecture, as described above or with other techniques known to those skilled in the art.

Global sector erase decoders 540 control the voltages on erase source-lines S/L1 to S/LP. Source-lines S/L1 to S/LP are electrically isolated from source-lines in other sectors, so that each group of M/P bit-lines across the N memory arrays or segments 330-1 to 330-N constitutes an erase sector having an independently controllable source erase voltage, which allows each sector to be erased independently from other sectors.

During a write to a selected memory cell, the high bit-line and word-line voltages for the selected memory cell can create large voltage differences or electric fields between the floating gate and drain or control gate of unselected memory cells and thereby induce undesirable Fowler-Nordheim tunneling that disturbs threshold voltages of these unselected memory cells, which can degrade the stored analog/multi-level signal. Thus, with multiple memory arrays or segments and independently controlled sectors, fewer memory cells are on the same column so that programming a selected memory cell disturbs fewer unselected memory cells, resulting in less accumulated programming or write disturb for each memory cell, while still allowing simultaneous erasing of all memory cells from the same sector within each memory array or segment.

Furthermore, the connection of N memory arrays or segments 330-1 to 330-N can be easily reconfigured by changing the number of memory arrays or segments 330, and/or the number of rows of memory cells, and/or the number of columns of memory cells, and/or the number of erase sectors in response to different imaging processing applications or resolution formats, such as VGA having 640×480 pixels, SVGA having 800×600 pixels, XGA having 1024×768 pixels, and SXGA having 1280×1024 pixels.

Using an interleaved pipeline memory system, such as system 400 of FIG. 4, for the analog/multi-level memory 210 of FIG. 2, the very high bandwidth and sampling rate requirements for digital applications, such as digital still cameras, can be met. Thus, an analog/multi-level memory having a density of about 20 Mbits can store up to 16 frames with 1.3M pixels/frame or up to 64 frames with a standard VGA resolution of 307K pixels/frame. These and other suitable analog emory systems allow analog data to be stored, thereby eliminating the need for a digital memory device, which obviates the need for DSP and image compression. Consequently, the digital imaging system using an analog/multi-level memory is less costly and provides higher quality images than one using a digital memory with DSP and image compression circuits.

Referring back to FIG. 2, analog interface circuits 220 coupled to the analog/multi-level memory 210 can be used to access the desired stored analog data from memory locations in the memory 210. Analog interface circuits 220 can include a control circuit for selecting and routing the data to desired analog destinations or to an A/D converter 120 for subsequent routing to digital destinations.

To display an image at an analog destination, analog interface circuits 220 can access the desired analog image data from analog/multi-level memory 210 and transmit the data directly to the analog destination, such as an analog color display 230 or an analog printer 240. If the image data is to be used by a digital destination, interface circuit 220 can access and route the desired analog information to an A/D converter 120. The converted digital data can then be transmitted to the desired digital destinations via digital interface circuits 265. For example, the digital data can be transmitted and stored in a PC hard disk drive 275, which can then be accessed for a digital display 260, a digital printer 261, a software editing 262, or transmission through the Internet 255. The digital data can also be transmitted to NTSC/PAL encoders 270 for transforming the digital data into an analog television format, e.g., NTSC, for use by an appropriate television receiver 250, or to a various locations of kiosk/print clubs 271 for obtaining "on-the-spot" color pictures 272 or for storage for later retrieval 273. These kiosks are PC-based and are connected to a central file server, allowing them to be used for reviewing, editing, and obtaining color pictures "on the spot" or downloading image information to a personal account for later retrieval for a new picture.

Smaller removable analog or digital memory cards can also be included for use with other applications, such as digital still cameras. With digital still cameras, image sensor 110, analog/multi-level memory 210, interface circuits 220 and 265, and A/D converter 120 and other elements are typically embedded within the digital still camera. A separate removable analog/multi-level memory 280 and a separate removable digital memory 285 can be used to store image data so that the stored data is portable and can be more easily processed. Interface circuits 220 and 265 can transfer the desired image data formats to respective analog and digital memories 280 and 285, e.g., small Flash memory cards, for temporary (or permanent) storage and later processing to reconstruct the stored images.

Therefore, when digital data is needed, analog interface circuits 220 access analog/multi-level memory 210 and then A/D converter 120 converts the analog signal to the desired digital format. Accordingly, because imaging data is stored in analog rather than digital form, problems associated with storing large amounts of digital data, such as DSP image compression and lost information, are alleviated.

The above-described embodiments of the present invention are merely meant to be illustrative and not limiting. It will thus be obvious to those skilled in the art that various changes and modifications may be made without departing from this invention in its broader aspects. For example, even though much of the preceding discussion was aimed at digital imaging based on analog/multi-level memory technology, alternative embodiments can include any suitable application where a digital memory can be replaced with an analog/multi-level memory in accordance with this invention. Furthermore, depending on the type of application and bandwidth requirements, analog/multi-level storage devices with other than the interleaved pipelined memory architecture discussed above can also be used. Therefore, the appended claims encompass all such changes and modifications as fall within the true spirit and scope of this invention.

We claim:

1. A method of operating an imaging system, comprising:
   providing analog image data having a bandwidth from an image sensor;
   determining a number of non-volatile memory sections into which the image data will be written based on said bandwidth; and
   writing the image data into said number of memory sections in a parallel pipelined manner, wherein said bandwidth requires sampling at a first frequency and said writing involves sampling and writing at a second frequency, and wherein said determining a number is based on relation of the first and the second frequencies.

\* \* \* \* \*